United States Patent [19]

Yang et al.

[11] Patent Number: 5,436,190
[45] Date of Patent: Jul. 25, 1995

[54] METHOD FOR FABRICATING SEMICONDUCTOR DEVICE ISOLATION USING DOUBLE OXIDE SPACERS

[75] Inventors: Ming-Tzong Yang, Hsin Chu; Chung-Cheng Wu, Toucheng, I-Lan, both of Taiwan

[73] Assignee: United Microelectronics Corporation, Hsinchu, Taiwan

[21] Appl. No.: 344,007

[22] Filed: Nov. 23, 1994

[51] Int. Cl.[6] .......................................... H01L 21/76
[52] U.S. Cl. ........................................ 437/67; 437/72
[58] Field of Search ............................ 437/67, 72; 148/DIG. 85, DIG. 86, DIG. 50

[56] References Cited

U.S. PATENT DOCUMENTS

| 5,008,208 | 4/1991 | Liu et al. | 437/31 |
| 5,124,274 | 6/1992 | Ohki et al. | 437/61 |
| 5,130,268 | 7/1992 | Liou et al. | 437/67 |

FOREIGN PATENT DOCUMENTS

| 61-154144 | 7/1986 | Japan | 437/72 |
| 1134948 | 5/1989 | Japan . | |
| 669332 | 3/1994 | Japan . | |

OTHER PUBLICATIONS

"High Speed Bipolar ECL Devices Using a Vertical Isolated Self-Aligned Transistor" by T. Fujita et al, Japanese Journal of Applied Physics, vol. 22 (1983) Supplement 22-1 pp. 125-128.

"Sensitivity of Field Isolation Profiles to Active Pattern" by P. U. Kenkane et al, IEDM, 1993, pub by IEEE pp. 479-481.

*Primary Examiner*—George Fourson
*Attorney, Agent, or Firm*—George O. Saile

[57] ABSTRACT

A method for fabricating a very narrow electrical isolation trench in a semiconductor substrate for isolating the individual field effect transistors (FETs) is achieved. This method eliminates the oxide encroachment into the device area associated with LOCOS techniques, thereby increasing device density. The method involves etching trenches, less than one half micrometer in width in the silicon substrate and forming sidewall spacer in the trench. The trench is filled with doped polysilicon and planarized, forming a trench which is planar with the device region. These isolation trenches are made in both N and P-wells for fabricating CMOS circuits having ULSI densities.

22 Claims, 9 Drawing Sheets

METHOD FOR FABRICATING SEMICONDUCTOR DEVICE ISOLATION USING DOUBLE OXIDE SPACERS

BACKGROUND OF THE INVENTION (1) Field of the Invention

This invention relates to the fabrication of integrated circuits and more particularly to a method for forming narrow trench isolation for integrated circuit devices.

(2) Description of the Prior Art

Recent advances in semiconductor processing technologies have dramatically increased the circuit density on a chip. Some chips formed from the semiconducting substrate contain more than a million devices and their minimum dimension are less than a micrometer in size.

One semiconducting technology area that must keep pace with this down sizing of the semiconductor device is the isolation technology. This isolation technology is used to electrically isolate the individual devices on the chip.

The electrical isolation used on some the first integrated circuits built consisted of an impurity diffused region around the individual device region having a dopant opposite in type to the device region. The electrical isolation was achieved by maintaining a reverse bias on the p-n junction. However, because the dopant diffused out from the isolation region during subsequent hot processing, down sizing was difficult to achieve and because of the high parasitic capacitance associated with the junction, circuit performance was poor. This technology was later replaced with an insulator having a high processing temperature and a reasonable low dielectric constant. The insulator of choice being silicon dioxide ($SiO_2$) because it can be readily formed by oxidizing the silicon substrate.

This dielectric isolation, commonly referred to as LOCal Oxidation of Silicon (LOCOS), is still widely used in the semiconductor industry. The isolation is formed by masking the active device region with a oxidation barrier layer, such as silicon nitride ($Si_3N_4$), and then oxidizing the exposed silicon in a oxidizing environment at high temperatures. For example, one can use steam at 900° to 1200° C. The area of the silicon substrate not covered by the silicon nitride layer is thermally oxidized forming a relatively thick silicon dioxide ($SiO_2$) and consuming a portion of the silicon and forming a thick silicon dioxide, commonly referred to a the field oxide.

Although this LOCOS isolation is still widely used in the semiconductor industry, it is known to have a number of limitations which hinder the progress towards further down sizing, which is needed for ultra large scale integration (ULSI). For example, a recent paper titled "Sensitivity of Field Isolation Profiles to Active Pattern" by P. U. Kenkare et al in the technical digest of the international Electron Device Meeting in Washington D.C., December 1993 and published by the IEEE, cover some of these limitations as one scales down the isolation to submicrometer dimensions.

The principle limitation is the encroachment of the thermal oxide into the active device region under the $Si_3N_4$ oxidation barrier mask. This lateral oxidation, usually referred to as the "birds beak" because of its shape, must be taken into consideration when lay out design of the circuit components and limits the packing density of the devices on the chip. Another limitation is the stress that results from the relatively thick field oxide. The thermal mismatch in the coefficient of expansion between the oxide and silicon lead to crystalline defects. For example, various types of crystal dislocation can occur, which degrade the electrical characteristics of the device. Still another limitation results from the increase in volume of the silicon dioxide compared to the volume of the silicon consumed in the reaction. This results in a non-planar surface with approximately one half of the $SiO_2$ thickness lying above the plain of the substrate. This can adversely affect the photolithography because of the shallow depth of focus required for submicrometer images. To over come the topography problem the silicon substrate can be recessed in the field oxide areas prior to thermal oxidation so as to form a more planar surface and a silicon nitride deposited on the sidewall to eliminate the oxide encroachment into the device region. For example, see the paper entitled "High Speed Bipolar ECL Devices Using a Vertical Isolated Self-Aligned Transistor" by T. Fujita et al, Japanese Journal of Applied Physics, Vol. 22 (1983) Supplement 22-1, pp 125-128.

More recently a method for forming shallow trench isolation has been described by F. T. Liou et al, U.S. Pat. No. 5,130,268, in which a shallow trench having silicon oxide sidewalls is selectively and partially filled with epitaxial silicon and then completely oxidized to form an isolation which is planar with the substrate surface. However, an implant is required in the bottom of the trench before oxidation to prevent inversion from occurring that can cause high leakage currents between active device regions. Also, the oxide encroachment into the device still remains as a problem.

Another isolation technique is described by M. S. Liu, whereby a deep trench is formed and filled with a doped polysilicon for isolating bipolar devices. However, these deep trenches are more difficult to make at sub-micrometer widths and also more expensive.

Therefore, it would be very useful to have a low cost process for make shallow trenches which are submicrometer in width and avoid encroachment of the oxide into the device region. It would be an additional benefit to eliminate channel stopper implant that can cause crystal damage.

SUMMARY OF THE INVENTION

It is a primary object of the invention to provide a process for fabricating electrical isolation trenches in the silicon substrate being equal to or less than one half micrometer.

It is another object of the invention to provide these trenches having no encroachment of the thermal oxide into the active device region.

It is still another object of the invention to provide a isolation trench which is free from crystalline stress and implant damage and also a trench that has high process yield, good reliability and is low in cost to make.

The method for achieving these objectives is by the formation of shallow isolation trenches having sub half micrometer widths and is intended for use on the P and N type wells of a complimentary metal-oxide semiconductor technology (CMOS). The process starts by anisotropically etching the shallow trenches in the silicon substrate using anisotropic plasma etching. A conformal layer of silicon oxide is deposited on the substrate and in the trench. The silicon oxide is then anisotropically etched back to form silicon oxide spacers on the sidewalls of the trench. The trenches are then filled with either a P-type or N-type impurity doped polysilicon by one of two methods. The polysilicon is then planarized to form a substrate with a planar trench structure. The masking layer over the active device region is then removed and a thermal oxide is grown over the device region to form the gate oxide for the field effect transistor (FET) and a thicker silicon oxide grown over the high doped trench areas.

The highly doped trench avoids the need for implantation in the bottom of the trench. This prevents the inversion that can occur from band bending at the low doped silicon-oxide surface interface. Since the polysilicon in the trench is not significantly oxidized there is no encroachment of the oxide into the active device region and the process is done with an economy of steps.

These very narrow electrical isolation trenches are used, in particular, for the isolation of both N and P channel field effect transistors (FETs). The N-channel FETs are formed in the P-Wells and the P-channel FETs are formed in the N-Wells on the silicon substrate and CMOS or other circuits formed therefrom. Only the trenches in a P-well for isolating N-channel FETs are shown in FIGS. 1 through 15. However it should be well understood by one skilled in the art that by including addition process steps not shown in these figures that other types of isolation can also be included on and in the substrate. For example, the trench isolation for P-channel FETs and LOCOS type insulation can also be included on the same chip by introducing addition steps during the fabrication of these narrow isolation trenches. However, the formation of the isolation trenches for the P-channel FET will be covered in detailed in the section on the description of the preferred embodiments.

BRIEF DESCRIPTION OF THE DRAWINGS

The objects and advantages of this invention are best understood by the detailed embodiment with reference to the attached drawings which are now briefly described.

DESCRIPTION OF THE PREFERRED EMBODIMENTS

Referring now to FIGS. 1 through 8, there is shown a first embodiment of the method for fabricating a very narrow trench isolation for electrically isolating adjacent and very closely spaced device regions in a P-well that is formed in the silicon substrate. These P-wells are generally used for fabricating N-channel FETs. Although the figures in this embodiment show the trench isolation for only P-wells, it should also be understood by one skilled in the art that these isolation trenches can also be formed in a N-well for fabricating P-channel FETs by using an impurity dopant of opposite polarity than that shown in the figures and that complementory-metal-oxide-semiconductor (CMOS) circuits can be formed therefrom.

Figure 1:
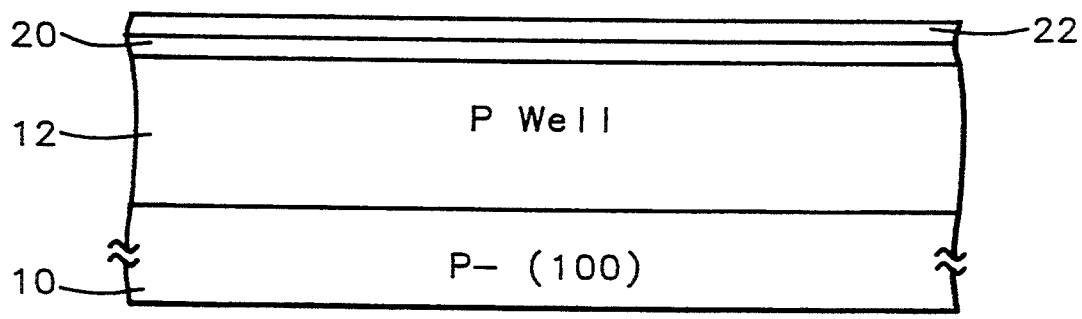
FIG. 1 through 8 is a schematic cross-sectional representation of the first embodiment of a method for forming the narrow trench isolation using a polysilicon deposition to fill the trench.

Now referring still to FIG. 1, a portion of the substrate 10 is shown having a P-well 12 formed therein. The substrate is usually composed of a single crystal silicon that is lightly doped P-type. The P-well and N-well, only the P-well is shown in FIG. 1, can be formed according to conventional twin-well CMOS processes. Also shown in FIG. 1, a first insulating layer 20 composed of silicon oxide is formed by thermal oxidation of the silicon substrate having a preferred thickness of between about 100 to 3000 Angstroms, alternatively layer 20 can also be a chemical vapor deposited oxide (CVD) silicon oxide having a thickness of between about 100 to 300 Angstroms. A second insulating layer 22, of a different composition type is deposited over the silicon oxide. The preferred second insulator 22 being a silicon nitride ($Si_3N_4$) and having a thickness of between about 100 to 3000 Angstroms. The insulating layers 20 and 22 are used to protect the active device areas while forming the isolation trench.

Figure 2:
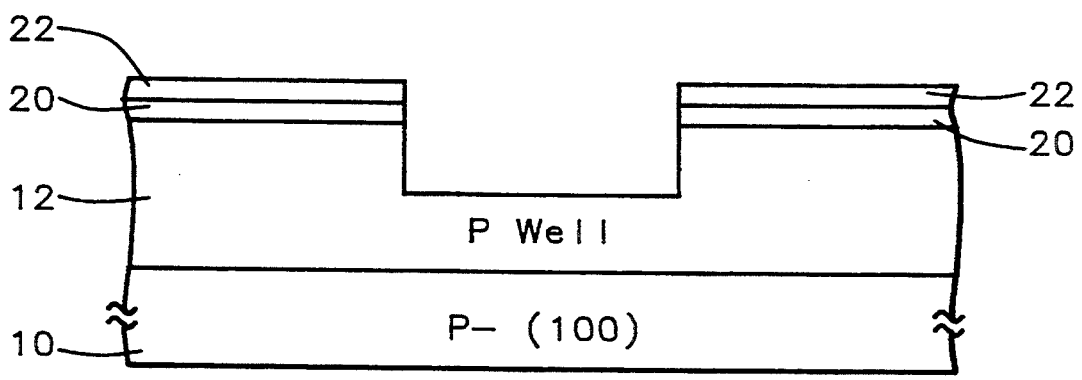

Referring next to FIG. 2, conventional photolithographic techniques are used to mask the active device area while exposing the trench areas around the device areas. The trenches are formed by anisotropically etching the insulating layers 20 and 22 in the exposed areas using a low pressure reactive plasma etcher and a gas mixture having a high etch rate selectivity of silicon oxide to silicon, such as, carbon tetrafluoride ($CF_4$) and hydrogen (H2). The silicon substrate 10 is then anisotropically etched to a depth of between about 0.1 to 3.0 micrometers. The preferred etching of the silicon substrate is also accomplished in a low pressure plasma etcher using a chlorinated gas mixture, Such as chlorine/argon (Cl/Ar) or dichlorodifluoromethane ($CCl_2F_2$). The width of the trench is preferably less than 0.5 micrometer in size to accommodate the high packing density required for ULSI circuits. Also, the trench is relatively shallow in depth to make filling the trenches with a polysilicon at a later process step easy to accomplish.

Figure 3:
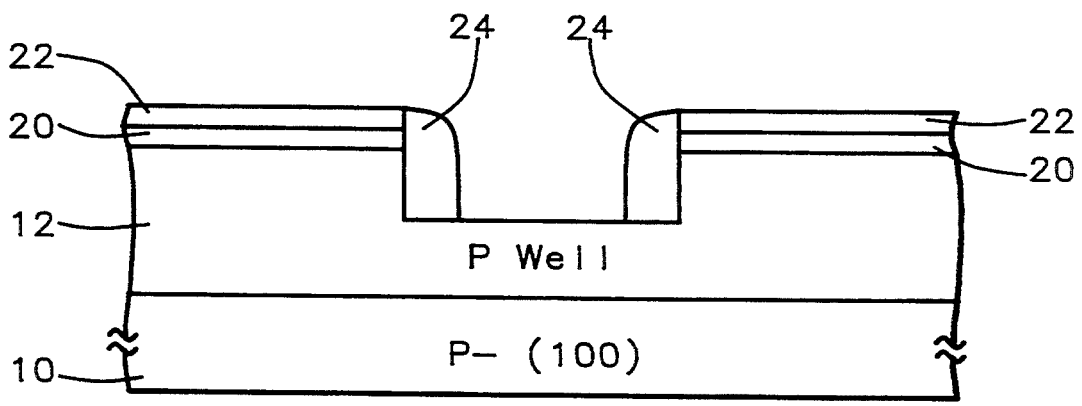
Figure 4:
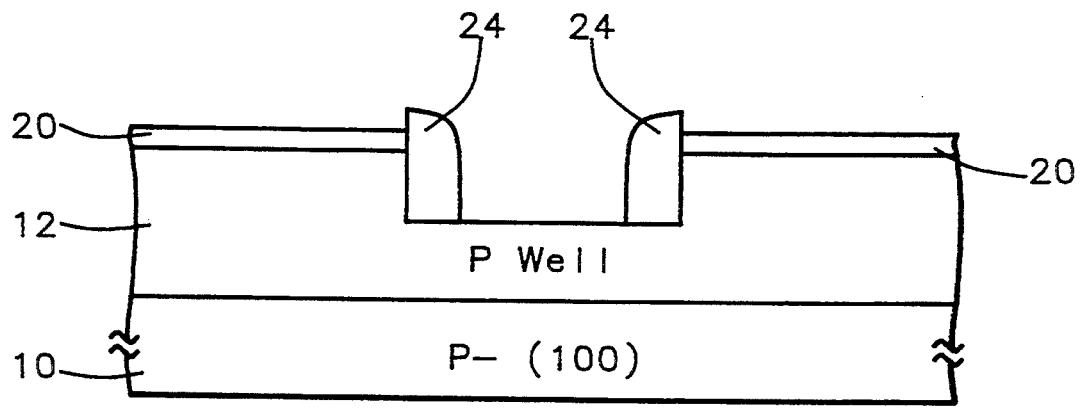

After stripping the photoresist, sidewalls spacers are formed in the trench by depositing a third insulating layer 24 having conformal coverage over the substrate surface and over, the trench recess. The insulating layer 24 is then anisotropically etched to the silicon nitride surface forming sidewall spacers 24 and completely removing the layer 24 elsewhere on the substrate, as shown in FIG. 3. The preferred insulating layer 24 is a silicon oxide having a deposition thickness of between about 500 to 5000 Angstroms and after etch back the sidewall spacers are between about 300 to 4000 Angstroms in width. The deposition process of choice is a Atmospheric Pressure Chemical Vapor Deposition (APCVD) or alternatively a Low Pressure CVD (LPCVD) technique having a deposition temperature of between about 300° to 900° C. The deposition can be accomplished in a process gas mixture containing silane ($SiH_4$) and oxygen ($O_2$) or dichlorosilane ($SiCl_2H_2$) and water ($H_2O$). Still a third method of forming layer 24 is by chemical vapor deposition using tetraethoxysilane (TEOS). The silicon nitride layer 22 is now completely removed in a wet etch, as shown in FIG. 4. The preferred etchant being a hot phosphoric acid solution etch at about 180° C.

Figure 5:
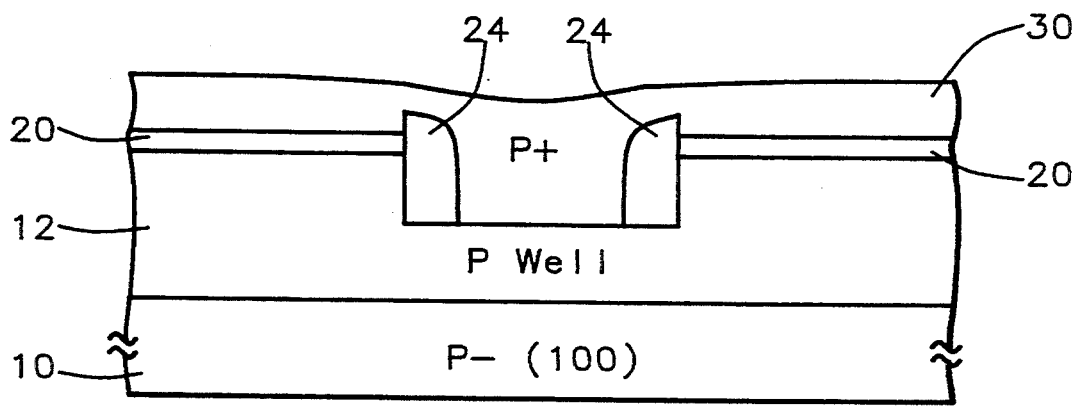

Referring now to FIG. 5, a polysilicon layer 30 is deposited undoped to a thickness sufficient to fill the trench and form a planar surface over the narrow trench. For a conformal coating the polysilicon thickness should be greater than half the width of the opening between the sidewall spacers 24. For example, if the etched trench is 0.5 micrometers wide and the sidewall spacers are each 0.05 micrometers wide, then the preferred thickness of the polysilicon layer 30 should be between about 2000 to 5000 Angstroms in order to fill the 0.4 micrometer wide opening and sufficiently planarize the surface. This planar surface is require in a later process step, when a blanket etch is used to etch back the polysilicon layer 30.

The polysilicon layer 30 over the trenches in the P-well is appropriately doped by implanting a P-type impurity and the polysilicon layer 30 over the trenches in the N-well is appropriately doped by implanting a N-type impurity. This is achieved, as is commonly practiced in the industry, by first masking with photoresist one area and implanting the desired dopant type and then repeating the process by masking the other area and implanting the other dopant type. For example, the region over N-wells can be masked and the P-type species implanted in the polysilicon layer over the P-wells and then masking the P-well region and implanting the N-type impurity in the polysilicon layer over the N-well. Only the P-well structure is depicted in FIG. 5. The preferred dopant species for the P doped trenches is boron and the preferred dopant species for the N doped trenches is phosphorus. The implant doses are chosen so that after the impurity diffusion drive-in cycle is completed, the dopant concentration in the P-type isolation trench is between about 1 E 18 to 1 E 22 atoms/$cm^3$ and the concentration in the N-type isolation trench is also between about 1 E 18 to 1 E 22 atoms/$cm^3$.

Figure 6:
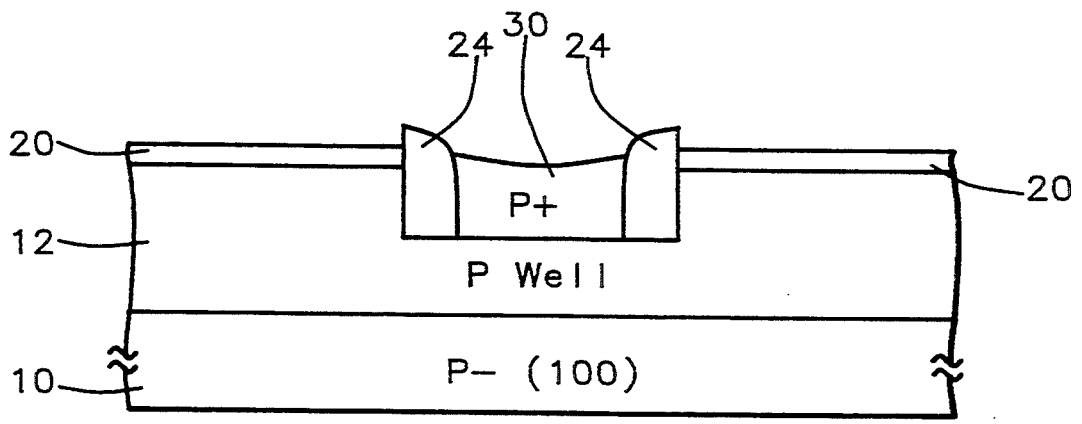

Referring now to FIG. 6, the first polysilicon layer 30 which was made planar over the narrow trenches by depositing a sufficiently thick layer is etched back exposing the top surface of the first insulation layer 20 forming a polysilicon filled trench which is planar with the active device region. The preferred etch is carried out in a reactive plasma etcher using a gas mixture of sulphur hexafluoride ($SF_6$), oxygen ($O_2$) and argon (Ar) or alternatively a carrier gas of argon containing chlorine ($Cl_2$) or hydrogen bromide (HBr) can be used.

Alternatively, the isolation trenches can be filled with an in situ doped polysilicon having comparable concentrations. However, in this process the P-type doped trenches and N-type doped trenches must be etched and filled separately and requiring two sequential trench etching and deposition steps, one for each dopant type. The first polysilicon layer must be doped and etched back before the second polysilicon deposition and trenches are etched.

Figure 7:
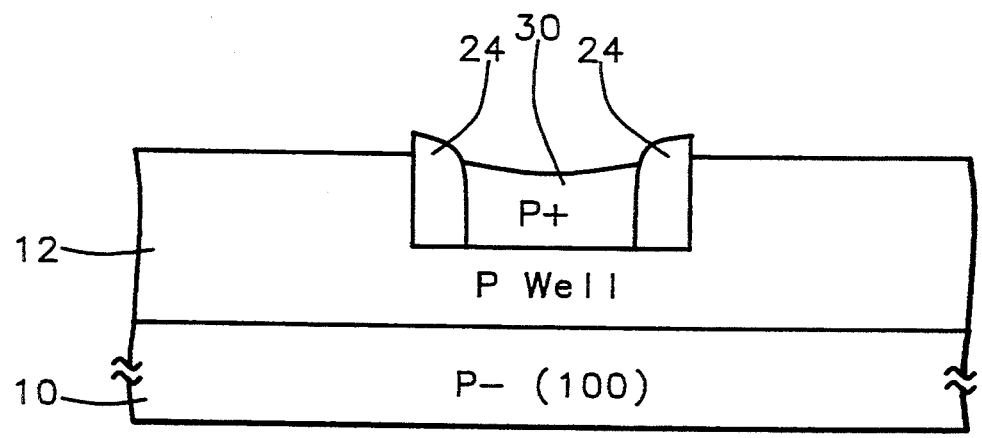
Figure 8:
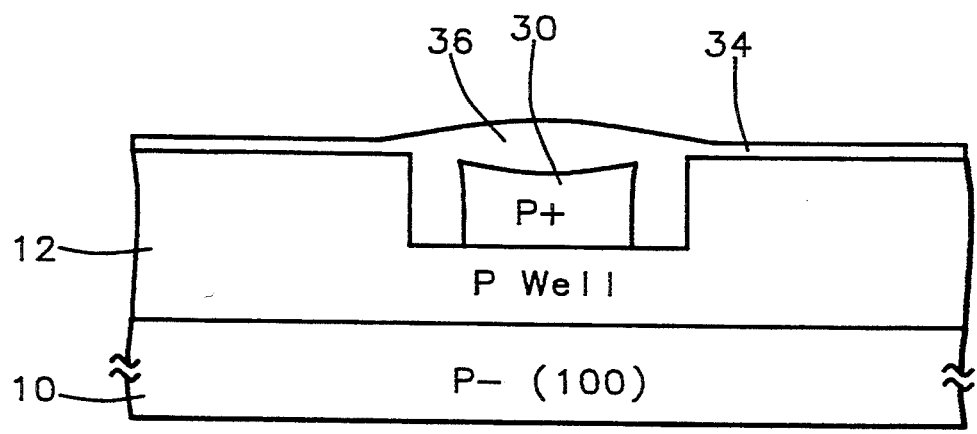

Now as shown in FIG. 7, the first insulating layer 20 protecting the active device region is removed by wet etching. The preferred etching solution being a conventional buffered hydrofluoric acid. The electrical isolation trenches are now completed by growing a gate oxide 34 on active device regions for the field effect transistor and simultaneously growing a thicker oxide 36 over the trench polysilicon 30 and thereby completing the double spacer isolation trench, as shown in FIG. 8. The thicker oxide being a result of the enhanced oxidation rate naturally occurring from the higher dopant concentration.

Figure 9:
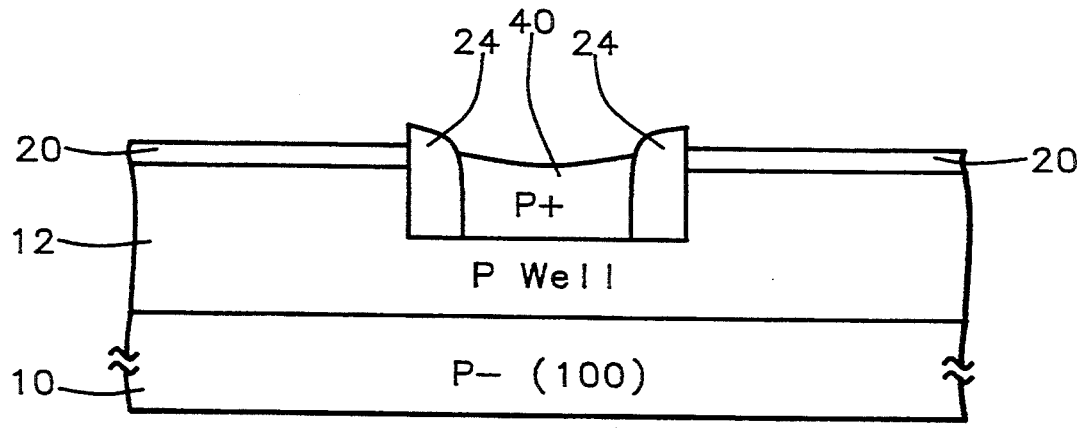
FIG. 9 through 11 is a schematic cross-sectional representation of the second embodiment of a method for forming the narrow trench isolation using a selective epitaxial deposition with in situ doping.
Figure 10:
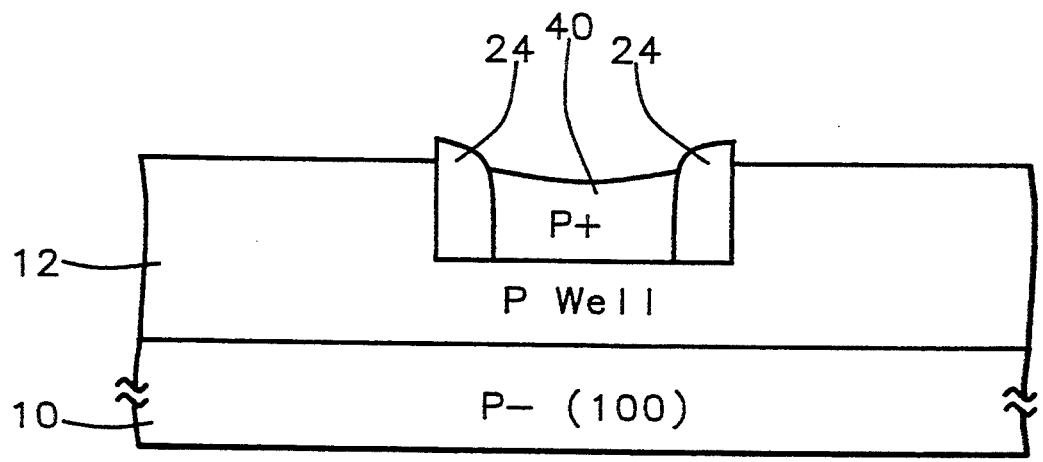
Figure 11:
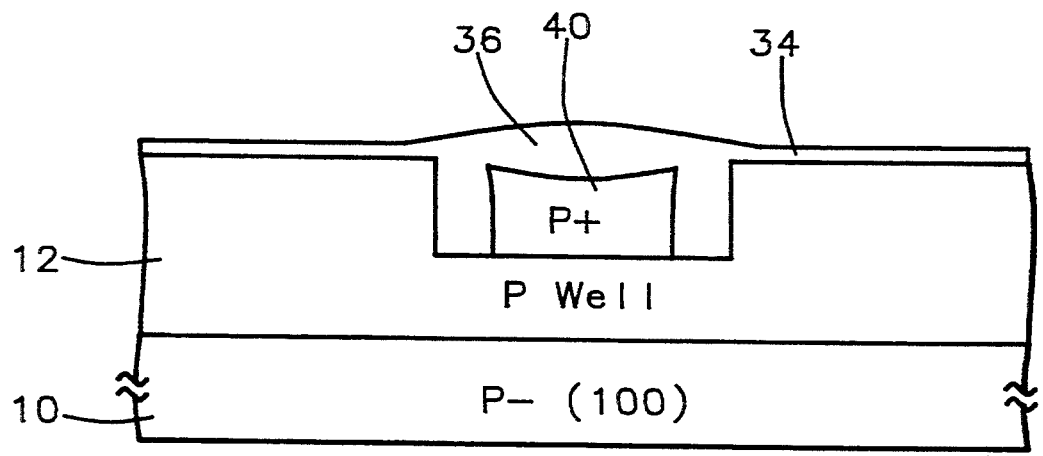

Referring more particularly to FIGS. 9 through 11, a second embodiment is described for forming the electrical isolation trench using a selective silicon epitaxial deposition to fill the trenches. This method for forming the isolation structure is identical to the first embodiment up to and including the removal of the second insulating layer 22, composed of silicon nitride, as depicted in FIG. 4. Therefore, the same numbers are used in FIGS. 9 through 11 of the second embodiment for identical structures that exist in the Figs. of the first embodiment.

The second embodiment, starting with FIG. 9, shows the isolation trench formed in the P-well 12 having the double sidewall spacers 24 and a bottom surface of exposed crystalline silicon. A selective epitaxial deposition of type I, as is well known in the semiconductor industry, is used so that the silicon nucleate on the exposed silicon surface in the trench but not on the oxide surface. The epitaxial silicon is deposited undoped to a thickness equal to the trench depth and then implanted with P-type dopant, such as boron ($B^{11}$) in the P-well areas, as shown in FIG. 9. The undoped epitaxial filled trenches in N-well areas can likewise be doped with an N-type dopant using implantation, such as with phosphorus ($p^{31}$) (not shown in FIG. 9). As is well understood by those skilled in the art, a photoresist block-out mask can be used to avoid ion implantation in unwanted areas. The preferred deposition is achieved with a reactive gas of silane ($SiH_4$) at a temperature of between about 950° to 1100° C.

Alternatively, the trenches can be in situ doped during the selective epitaxial deposition, thereby forming a planar isolation structure, as also shown in FIG. 9. However, in this particular instance, the trenches in the P-well and N-well are etched separately and filled separately, similar to the second method for filling the trenches with in-situ doped polysilicon as detailed in the first embodiment. The preferred deposition process is also a chemical vapor deposition (CVD) using a silicon source of silane ($SiH_4$) using appropriate dopant gases and using appropriate deposition parameters for selective deposition.

Referring now to FIG. 10, the protective oxide layer 20 is remover over the active device region by using a suitable etchant, such as a hydrofluoric acid solution. The isolation trench having the double sidewall spacer and polysilicon and surrounding the active device regions are now completed by forming a gate oxide 34 over the device region and a thicker oxide over the epitaxial trench area 36 as shown in FIG. 11.

Figure 15:
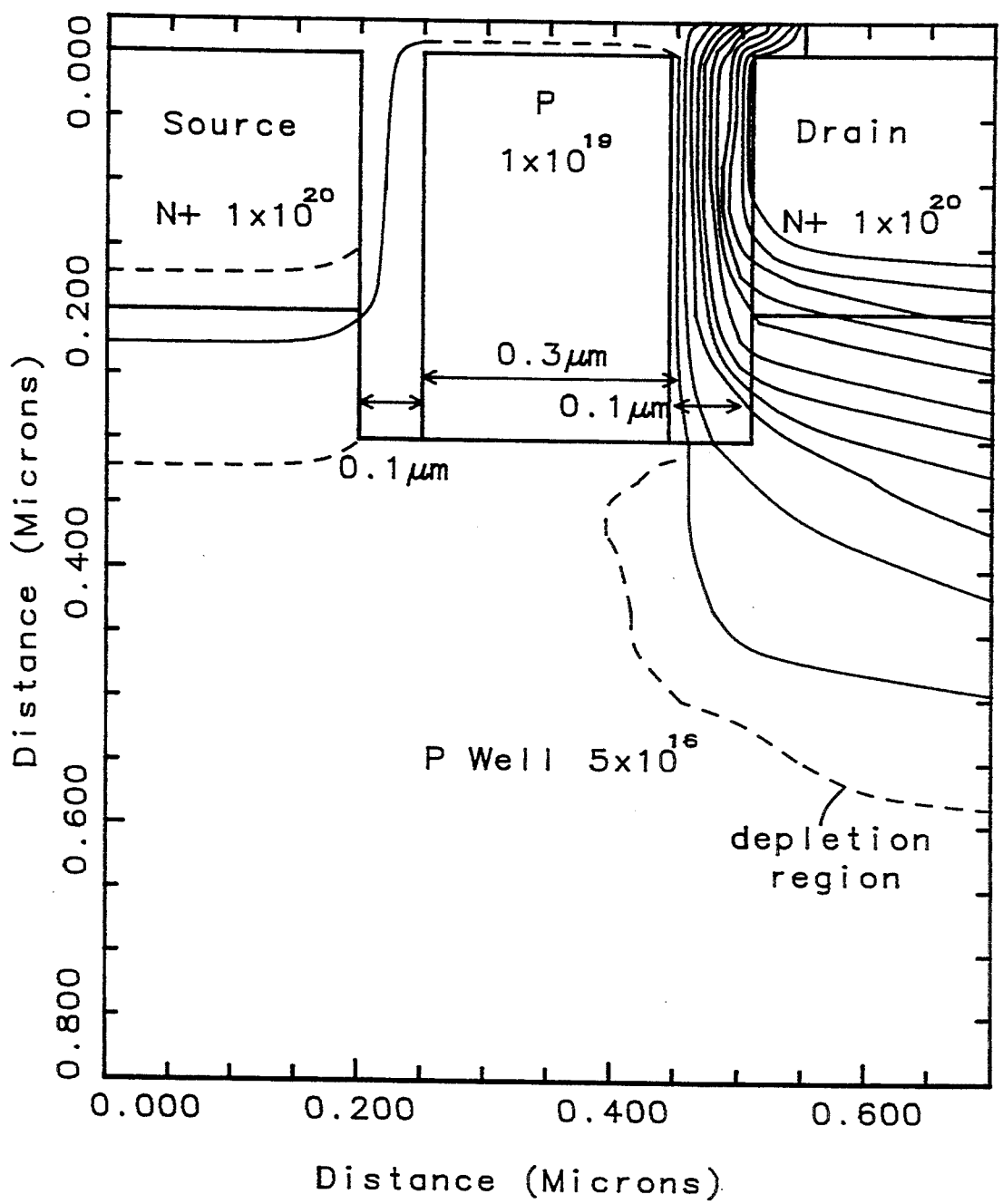
FIG. 15 and 16 are simulations of the equipotential contour lines and the depletion region for the drain of a N-channel FET near a narrow trench isolation having a gate bias of 0 and 10 volts respectively.
Figure 16:
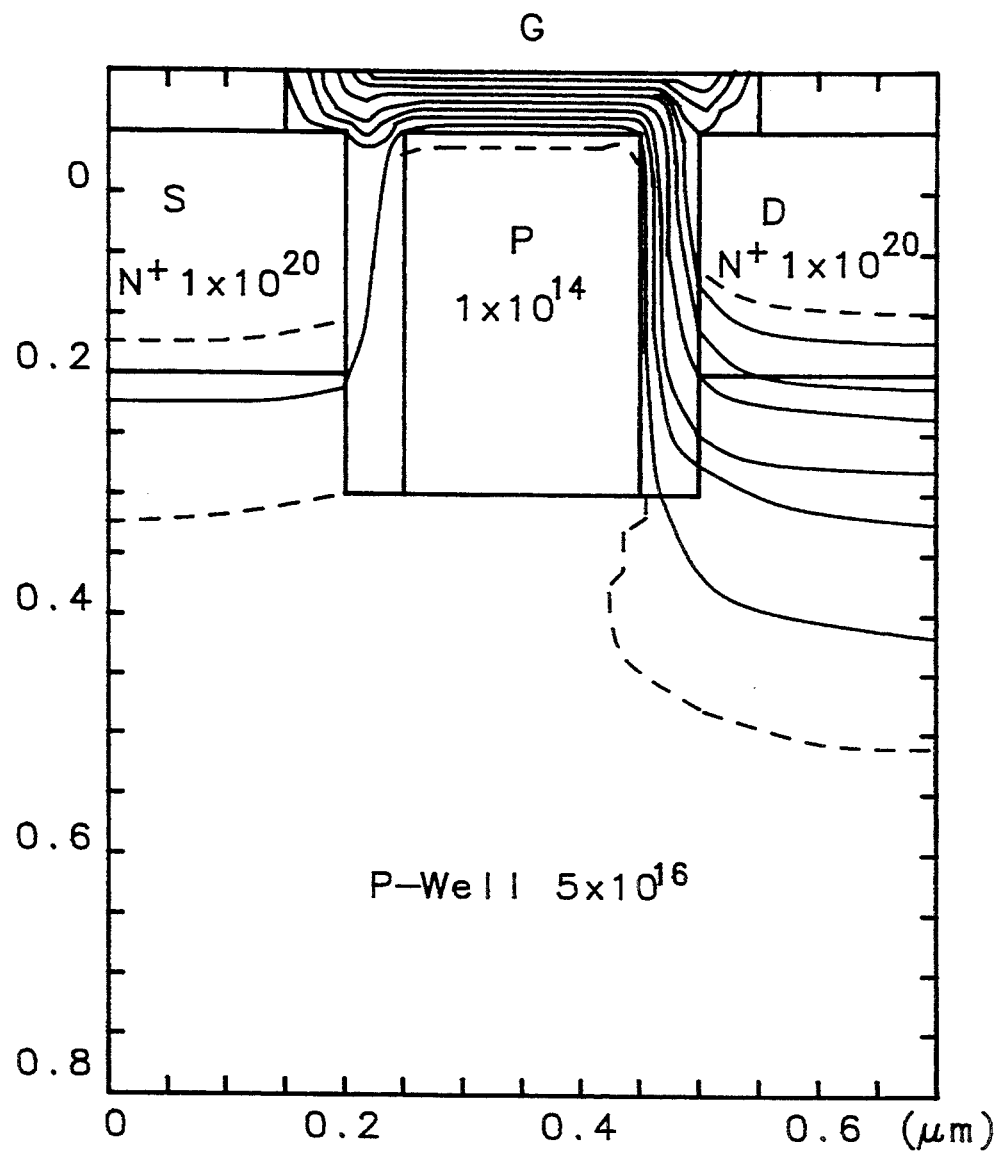
Figure 17:
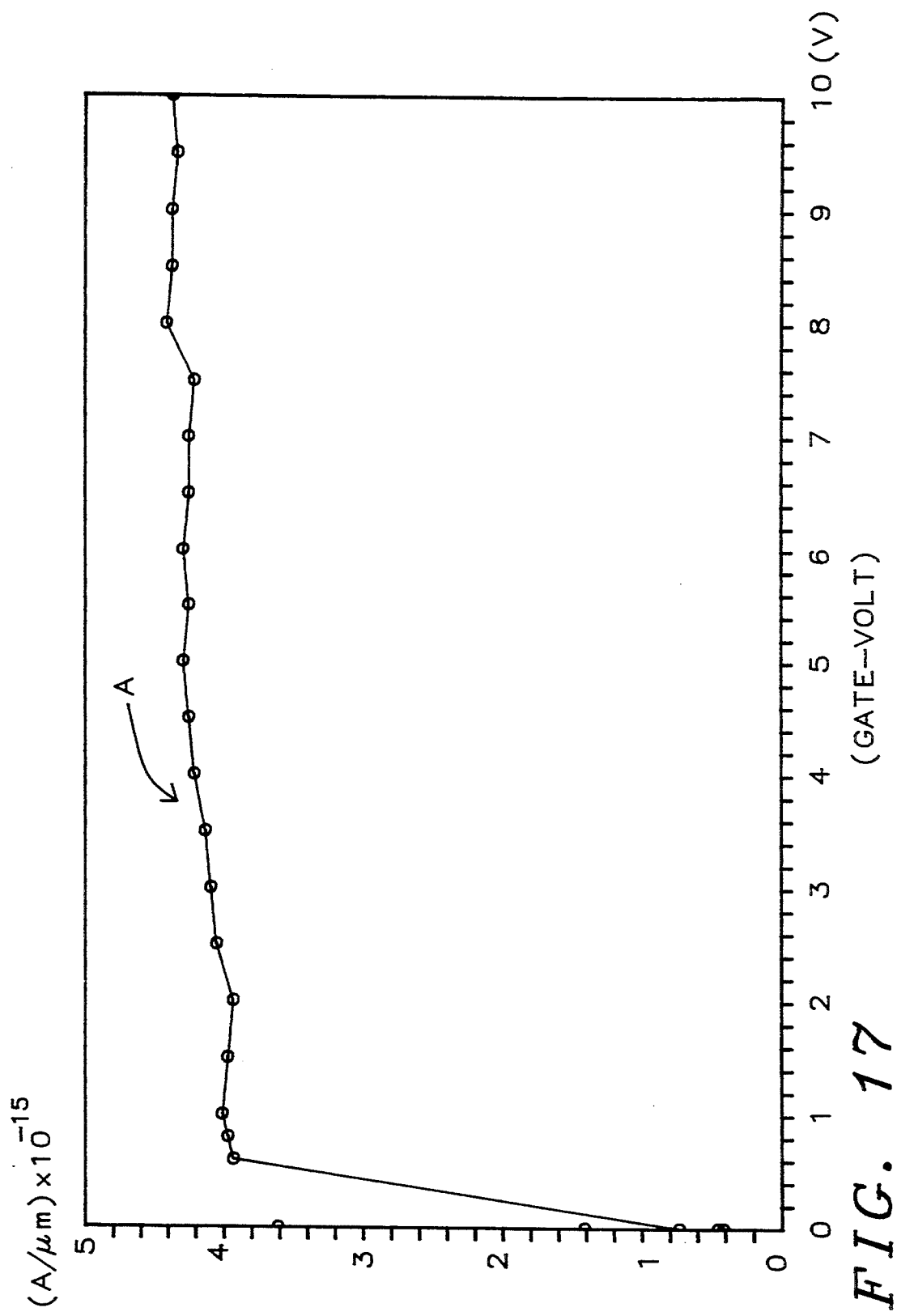
FIG. 17 shows the leakage current for the doubled oxide spacer isolation/ as a function of gate voltage.

The EXAMPLE included in this invention shows good D.C. electrical characteristics for a simulated bias of 10 volts on the N doped drain adjacent to the P doped double oxide spacer isolation and the gate over the trench, the substrate and source held at 0 (ground) bias. The details are described in the EXAMPLE and the simulation is shown in FIG. 15. A second simulation example is also shown in the EXAMPLE for a drain voltage of 5 volts, a gate voltage over the trench of 10 volts and the substrate and source at ground potential (0 volts). The equi-potential lines and depletion profiles, for this second simulation, are shown in FIG. 16 and the leakage current from drain to source across the isolation trench vs the gate voltage on the trench, is shown in FIG. 17. As can be seen from FIG. 17, the leakage current is quite low, being less than 1 E−14 Ampere.

Figure 12:
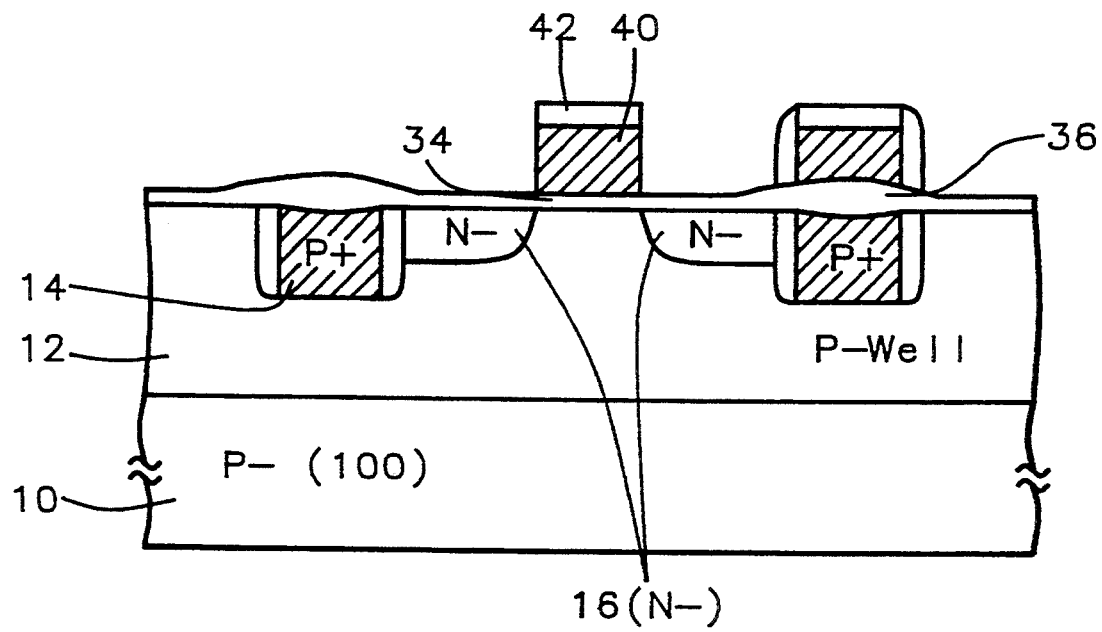
FIG. 12 through 14 is a schematic cross-sectional representation of forming a FET utilizing either narrow trench isolation embodiments.
Figure 13:
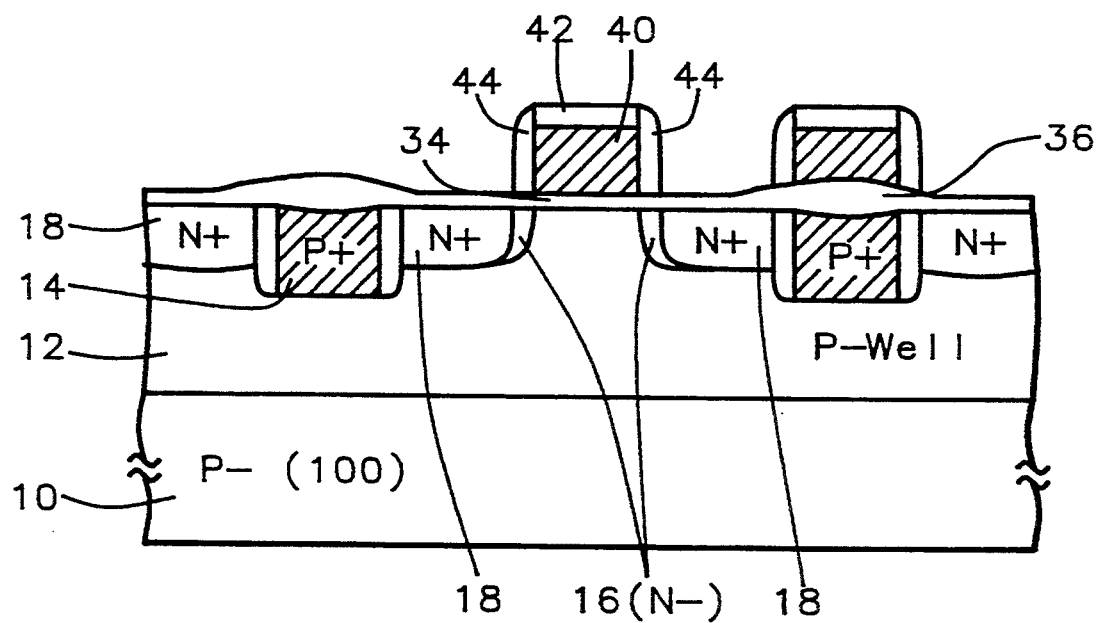
Figure 14:
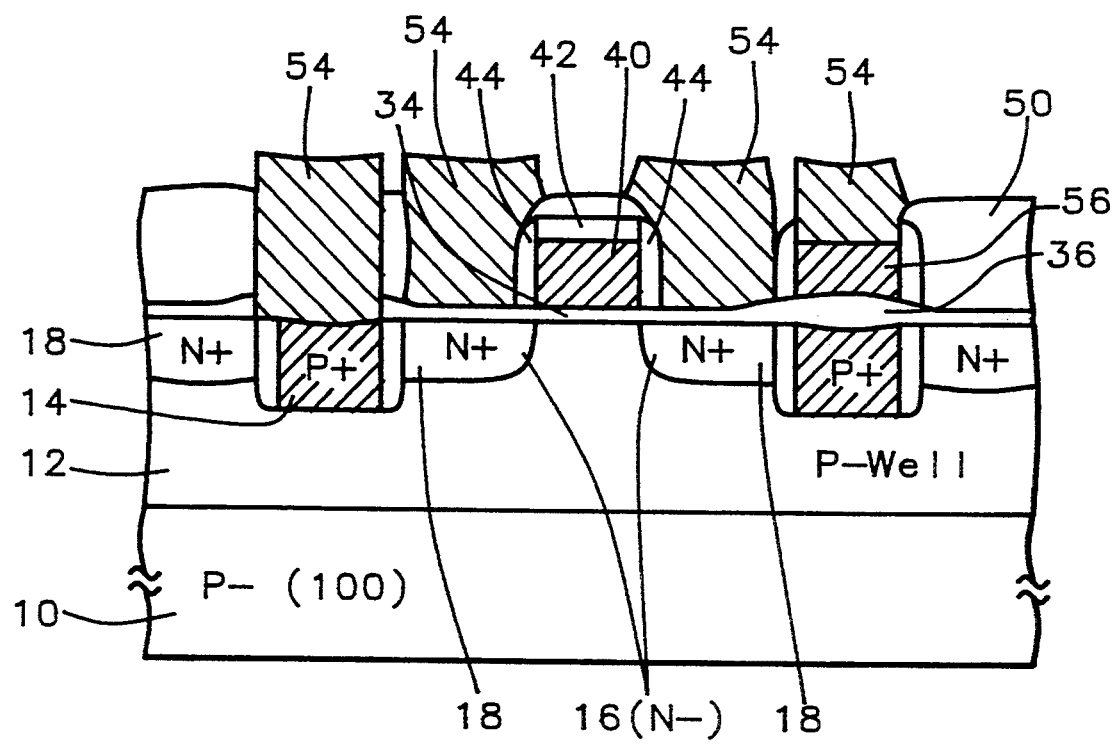

Referring now more particularly to FIGS. 12 through 14 is shown a third embodiment of the invention for fabricating a field effect transistor (FET) utilizing the double spacer isolation trench described herein. The FIGS. 12 through 14 depict the method for fabricating a N-channel FET in a P-well, but it should be understood by one skilled in the art that a P-channel FET can also be fabricated by simply using an impurity dopant of opposite polarity. In fact, by appropriately masking and doping, both types of FETs can be fabricated on the same chip concurrently in P and N type wells.

Referring now to FIG. 12, a schematic cross-section is shown a P-well 12 formed in the substrate 10 have a isolation trench 14 surrounding and isolating an active device region. The gate oxide 34 and the thicker isolation trench oxide 36 are formed as the last process step during fabrication of the double spacer trench isolation. The preferred thickness of the gate oxide is between about 30 to 500 Angstroms and the thickness of the trench oxide 36 is between about 40 to 2000 Angstroms.

Within the ;active device region and over the gate oxide is formed the polysilicon gate electrode 40 of the N-channel FET. The gate electrode 40 and conducting lines elsewhere on the substrate are formed by depositing and patterning an appropriately doped polysilicon layer. The thickness of the polysilicon layer 40 being between about 500 to 5000 Angstroms. A lightly N doped source/drain 16 is then formed by ion implantation or POCl3 doped with arsenic or phosphorus having a concentration of between about 1 E 18 to 1 E 22 atoms/cm$^3$.

Referring next to FIG. 13, insulating sidewall spacers 44 are formed on the sidewalls of the gate electrode 40 and a high dose N type, such as arsenic, is implanted to form the source/drain ohmic contacts 18. The sidewall spacer is formed by depositing an insulating layer 44 by chemical vapor deposition, such as a deposition of silicon oxide using tetraethoxysilane (TEOS) at a temperature between about 650° to 900° C. or silane (SiH$_4$) at a temperature between about 350° to 600° C. and having a thickness between about 500 to 5000 Angstroms and then anisotropically etching back said layer 44 to form the sidewall spacers. Next, the source/drain ohmic contacts are formed by implanting arsenic (As$^{75}$) or/and phosphorus (P$^{31}$) having a concentration of between about 1 E 18 to 1 E 22 atoms/cm$^3$.

Referring now to FIG. 14, a insulating layer 50 having a low flow temperature is deposited and annealed to planarize the surface. The preferred insulator is a borophosphosilicate glass (BPSG) having a preferred thickness being between about 1000 to 15000 Angstroms. Conventional photolithographic techniques are used to open contacts in the BPSG and the first level metal 54 is deposited and patterned using photoresist masking and anisotropic etching in a low pressure plasma etcher. The first level metal 54 composed of aluminum, aluminum/silicon/copper or aluminum/copper makes contact to the source/drain 18 areas, and polysilicon lines 56 formed from the polysilicon layer 40 during the patterning of the gate electrode 40 form portions of the interconnecting metallurgy on the chip. Although the substrate 10 in FIG. 14 shows only a P-well region it should be well understood by those skilled in the art that P-channel FET can also be fabricated in N-well regions on the substrate, as previously described.

This completes the FET structure having very narrow double spacer isolation trenches that are also very planar. The width of the trench being equal to or less than one half micrometer in width increases the circuit density on the chip.

The isolation trench is also very planar allowing for more reliable polysilicon and metal lines. The highly doped polysilicon in the trench eliminates the need for a channel stop implant which cause crystalline damage and higher leakage currents which degrade device performance. The highly doped polysilicon isolation trench also provides a means for making ease electrical contact to the substrate and the P and N wells.

While the invention has been particularly shown and described with reference to the preferred embodiment thereof, it will be understood by those skilled in the art that various changes in form and details may be made without departing from the spirit and scope of the invention.

EXAMPLE

A D.C. electrical simulation was modelled for the P doped trench having a width of 0.5 micrometers and a depth of 0.3 micrometers. The insulating sidewall spacers are 0.1 micrometers thick. The source/drain are adjacent to and on each side of the trench and a gate oxide is over the trench polysilicon as shown in FIG. 15. The polysilicon is doped P type at a concentration of 1 E 19 atoms/cm$^3$. The FIG. 15 also shows the equipotential lines and the depletion regions when the source, gate and substrate are all held at zero bias and the drain is biased at 10 volts. As can be seen from this simulation the depletion regions between source and drain on opposite sides of the isolation trench are well separated providing good device isolation.

A second D.C. electrical simulation is shown in FIG. 16 for a gate voltage of 10 Volts, a drain voltage of 5 Volts and the source and substrate held a ground potential (0 Volts). The depletion regions are also well separated, providing very good device isolation. The curve A in FIG. 17 shows the leakage current between the source and drain on opposite sides of the doubled oxide spacer isolation trench as a function of gate voltage. It is clearly seen that the leakage current is very low, being much less than 1 E $-$14 Ampere for gate voltages up to 10 Volts.

What is claimed is:

1. A method for fabricating electrical isolation trenches in a semiconduct or substrate having active device regions, comprising the steps of:

depositing a first insulating layer over said semiconductor substrate and over said active device regions;

depositing a second insulating layer over said first insulating layer, said second insulating layer being of different composition;

patterning said first and second insulating layers so as to leave portions over said active device regions and to expose trench isolation regions; and removing the portion of said first and second insulating layers over said trench isolation regions between and around said active device regions exposing said semiconductor substrate surface;

etching anisotropically said semiconductor substrate in said trench isolation regions to a depth and forming said isolation trenches;

depositing a third insulating layer over and in said isolation trenches and elsewhere over said second insulating layer;

etching anisotropically said third insulating layer to remove the portion of said third insulating layer on the surface of said second insulating layer, and forming insulating spacers on the sidewalls of said isolation trenches;

removing by isotropic etching said second insulating layer from said active device regions;

depositing a polysilicon layer over and in said isolation trenches and elsewhere over said semiconductor substrate;

blanket etching said polysilicon layer to remove the portion of said polysilicon layer on said first insulating layer over said active device regions, and leaving said isolation trenches filled with said polysilicon between said insulating spacers and planar with the surface of said active device regions;

removing by isotropic etching said first insulating layer exposing the surface of said active device region;

forming by thermal oxidation a gate oxide over said active device region and an oxide over said polysilicon in said isolation trenches that is thicker than said gate oxide, and completing said isolation trenches around and between said active device regions.

2. The method of claim 1 wherein said first insulating layer is composed of silicon oxide having a thickness of between about 30 to 3000 Angstroms.

3. The method of claim 1 wherein said second insulating layer is composed of silicon nitride having a thickness of between 30 to 3000 Angstroms.

4. The method of claim 1 wherein said etching of said narrow isolation trench is to a depth of between about 0.1 to 5.0 micrometers.

5. The method of claim 1 wherein the width of said electrical isolation trench is greater than 0.05 micrometers.

6. The method of claim 1 wherein said third insulating layer is composed of chemical vapor deposited silicon oxide having a thickness of between about 100 to 5000 Angstroms.

7. The method of claim 1 wherein said insulating spacers on the sidewalls of said electrical isolation trenches have a thickness of between about 100 to 5000 Angstroms.

8. The method of claim 1 wherein said polysilicon layer is deposited by chemical vapor deposition and is sufficiently thick enough to form a planar surface over said electrical isolation trenches.

9. The method of claim 8 wherein said polysilicon layer is doped by implantation with P-type ion species over said electrical isolation trenches in P-well region and N-type ion species over said electrical isolation trenches in an N-well region.

10. The method of claim 1 wherein said gate oxide is formed by thermal oxidation having a thickness of between about 30 to 500 Angstroms.

11. The method of claim 1 wherein said oxide over polysilicon in said isolation trenches is formed by thermal oxidation and has a thickness of between about 40 to 2000 Angstroms.

12. A method for fabricating field effect transistor having electrical isolation trenches in a semiconductor substrate with active device regions, comprising the steps of:

forming said electrical trench by:

depositing a first insulating layer over said semiconductor substrate and over said active device regions, depositing a second insulating layer over said first insulating layer, said second insulating layer being of different composition, patterning said first and second insulating layer so as to leave portions over said active device regions and to expose trench isolation regions, and removing the portion of said first and second insulating layers over said trench isolation regions between and around said active device regions exposing said semiconductor substrate surface, etching anisotropically said semiconductor substrate in said trench isolation regions to a depth and forming said isolation trenches, depositing a third insulating layer over and in said isolation trenches and elsewhere over said second insulating layer;

etching anisotropically said third insulating layer to remove the portion of said third insulating layer on the surface of said second insulating layer and forming insulating spacers on the sidewalls of said isolation trenches, removing by isotropic etching said second insulating layer from said active device regions, depositing a polysilicon layer over and in said isolation trenches and elsewhere over said semiconductor substrate, blanket etching said polysilicon layer to remove the portion of said polysilicon layer on said first insulating layer over said active device regions, and leaving said isolation trenches filled with said polysilicon between said insulating spacers and planar with the surface of said active device regions, removing by isotropic etching said first insulating layer exposing the surface of said active device region, forming by thermal oxidation a gate oxide over said active device region and an oxide over said polysilicon in said isolation trenches that is thicker than said gate oxide, and completing said isolation trenches, around and between said active device regions;

forming a polysilicon gate electrode structure in said active region and polysilicon lines elsewhere on said substrate;

forming a source/drain structure in said active device region adjacent to said polysilicon gate electrode and forming said field effect transistor;

depositing a planarizing insulator over said field effect transistor in said active device region and elsewhere over said semiconduct or substrate;

forming openings in said planarizing insulator to said source/drain, to said polysilicon lines and said isolation trenches;

forming metal contacts in said openings and metal lines elsewhere on said semiconductor substrate and completing said field effect transistor having said isolation trenches around and electrical isolating said field effect transistor from other regions on said semiconduct or substrate.

13. The method of claim 12 wherein said first insulating layer is composed of silicon oxide having a thickness of between about 30 to 3000 Angstroms.

14. The method of claim 12 wherein said second insulating layer is composed of silicon nitride having a thickness of between 30 to 3000 Angstroms.

15. The method of claim 12 wherein said etching of said isolation trench is to a depth of between about 0.1 to 5.0 micrometers.

16. The method of claim 12 wherein the width of said isolation trench is greater than 0.05 micrometers.

17. The method of claim 12 wherein said third insulating layer is composed of chemical vapor deposited silicon oxide having a thickness of between about 100 to 5000 Angstroms.

18. The method of claim 12 wherein said insulating spacers on the sidewalls of said electrical isolation trenches have a thickness of between about 100 to 5000 Angstroms.

19. The method of claim 12 wherein said polysilicon layer is deposited by chemical vapor deposition and is sufficiently thick enough to form a planar surface over said electrical isolation trenches.

20. The method of claim 19 wherein said polysilicon layer is doped by implantation with P-type ion species over said electrical isolation trenches in a P-well region and N-type ion species over said electrical isolation trenches in an N-well region.

21. The method of claim 12 wherein said gate oxide is formed by thermal oxidation having a thickness of between about 30 to 500 Angstroms.

22. The method of claim 12 wherein said oxide over polysilicon in said isolation trenches is formed by thermal oxidation and has a thickness of between about 40 to 2000 Angstroms.

* * * * *